United States Patent
Zhang (10) Patent No.: US 9,640,483 B2
(45) Date of Patent: May 2, 2017

(54) VIA, TRENCH OR CONTACT STRUCTURE IN THE METALLIZATION, PREMETALLIZATION DIELECTRIC OR INTERLEVEL DIELECTRIC LAYERS OF AN INTEGRATED CIRCUIT

(71) Applicant: STMicroelectronics, Inc., Coppell, TX (US)

(72) Inventor: John Hongguang Zhang, Fishkill, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 14/724,975

(22) Filed: May 29, 2015

(65) Prior Publication Data

US 2016/0351500 A1  Dec. 1, 2016

(51) Int. Cl.
    *H01L 29/80* (2006.01)
    *H01L 23/535* (2006.01)
    *H01L 23/532* (2006.01)
    *H01L 23/528* (2006.01)

(52) U.S. Cl.
    CPC .......... *H01L 23/535* (2013.01); *H01L 23/528* (2013.01); *H01L 23/53228* (2013.01); *H01L 23/53257* (2013.01)

(58) Field of Classification Search
    CPC ............ H01L 23/535; H01L 23/53257; H01L 23/53228; H01L 23/528
    USPC .................................. 257/278, 499
    See application file for complete search history.

(56) References Cited

U.S. PATENT DOCUMENTS

| | | | |
|---|---|---|---|
| 2004/0251549 A1* | 12/2004 | Huang | H01L 21/76804 257/758 |
| 2009/0121321 A1* | 5/2009 | Miccoli | G03F 7/70625 257/618 |
| 2012/0149186 A1* | 6/2012 | Niimi | H01L 21/28202 438/591 |

* cited by examiner

*Primary Examiner* — Long K Tran
(74) *Attorney, Agent, or Firm* — Gardere Wynne Sewell LLP (57) ABSTRACT

A semiconductor substrate includes a doped region. A premetallization dielectric layer extends over the semiconductor substrate. A first metallization layer is disposed on a top surface of the premetallization dielectric layer. A metal contact extends from the first metallization layer to the doped region. The premetallization dielectric layer includes sub-layers, and the first metal contact is formed by sub-contacts, each sub-contact formed in one of the sub-layers. Each first sub-contact has a width and a length, wherein the lengths of the sub-contacts forming the metal contact are all different from each other.

37 Claims, 8 Drawing Sheets

FIG. 11

VIA, TRENCH OR CONTACT STRUCTURE IN THE METALLIZATION, PREMETALLIZATION DIELECTRIC OR INTERLEVEL DIELECTRIC LAYERS OF AN INTEGRATED CIRCUIT

TECHNICAL FIELD

The present invention relates to integrated circuits and, in particular, to the formation of metal-filled vias, trenches or contact openings in the metallization (M), premetallization dielectric (PMD) or interlevel dielectric (ILD) layers of an integrated circuit.

BACKGROUND

Figure 1:
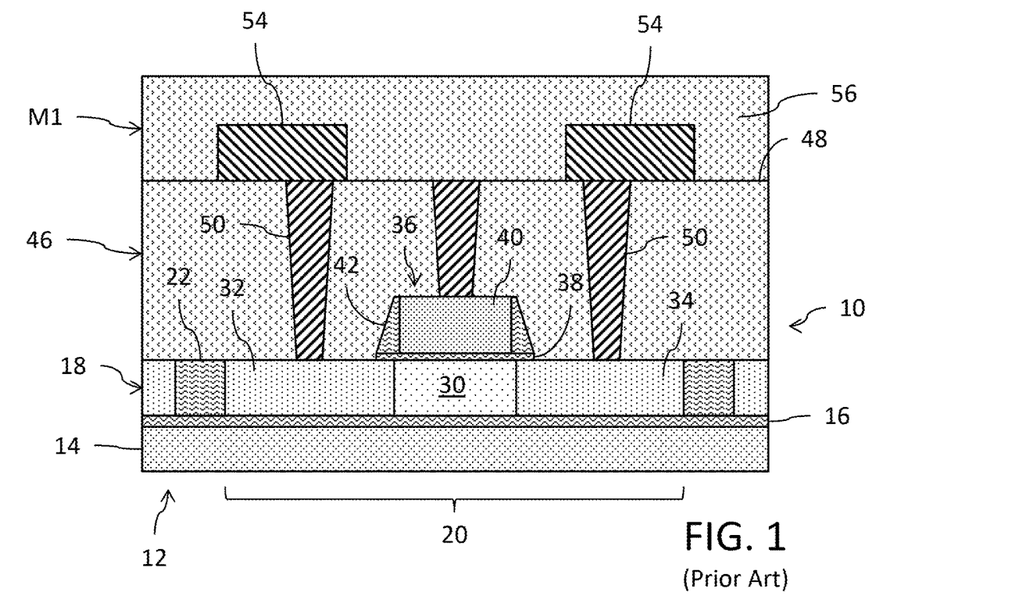
FIG. 1 illustrates the configuration of a prior art MOSFET device.

Reference is now made to FIG. 1 showing the general configuration of a conventional metal oxide semiconductor (MOS) field effect transistor (FET) 10 device. A substrate 12 supports the transistor. In this example, the substrate is of the silicon-on-insulator substrate 12 type which includes a substrate layer 14, a buried oxide (BOX) layer 16 and a semiconductor layer 18. An active region 20 for the transistor device is delimited by a peripherally surrounding shallow trench isolation 22 that penetrates through the layer 18. Within the active region 20, the layer 18 is divided into a channel region 30 which has been doped with a first conductivity type dopant, a source region 32 (adjacent the channel region 30 on one side) which has been doped with a second conductivity type dopant, and a drain region 34 (adjacent the channel region 30 on an opposite side from the source region 32) which has also been doped with the second conductivity type dopant. Where the MOSFET 10 device is of the p-channel type, the first conductivity type dopant is p-type and the second conductivity type is n-type. Conversely, where the MOSFET device is of the n-channel type, the first conductivity type dopant is n-type and the second conductivity type is p-type. A gate stack 36 is provided above the channel region 30. This gate stack 36 typically comprises a gate dielectric 38, a gate electrode 40 (for example, of metal and/or polysilicon material) and sidewall spacers 42 made of an insulating material such as silicon nitride (SiN) deposited on the sides of the gate dielectric 38 and gate electrode 40. An interlevel dielectric (ILD) or pre-metallization dielectric (PMD) layer 46 is provided above the substrate and the gate stack. A top surface 48 of the layer 46 is processed with a chemical-mechanical polishing (CMP) process to define a planar surface. A set of metal contacts 50, typically formed of tungsten, extend from the top surface 48 through the ILD/PMD layer 46 in metal-filled contact openings to make electrical contact with the source region 32, drain region 34 and gate electrode 40. A first metallization layer M1 is then provided above the ILD/PMD layer 46, with the first metallization layer M1 comprising metal lines 54 formed in metal-filled via and/or trench openings in contact with the contacts 50 and surrounded by a planarized dielectric material layer 56.

As feature sizes in integrated circuit devices continue to shrink and operational speed increases, there is a need to make a thicker ILD/PMD layer 46 so as to reduce capacitance between the first metallization layer M1 and the active region 20 as well as between the first metallization layer M1 and the gate electrode 40. The thicker ILD/PMD layer 46 and reduced feature size accordingly necessitates the use of high aspect ratio metal contacts 50 (i.e., contacts made in openings with a height/width ratio >>1, for example, ≥4). It is a challenge to provide such high aspect ratio contacts without incurring problems associated with open yield and increased contact resistance. There is accordingly a need in the art for an improved contact configuration for interconnecting the first metallization layer M1 to both the active region 20 and the gate electrode 40.

In addition, improved structures for the metal lines and metal vias in the metallization layers of integrated circuits are needed to ensure device reliability and improve signal performance through resistance adjustment.

SUMMARY

In an embodiment, an integrated circuit comprises: an insulating layer having a planar top surface; a first metal structure within the insulating layer; wherein the insulating layer comprises a plurality of sub-layers; wherein the first metal structure comprises a corresponding plurality of first sub-structures, each first sub-structure formed in one of the sub-layers and having a thickness equal to a thickness of the sub-layer within which it is formed, each first sub-structure having a width dimension and a length dimension; wherein one of the width dimension or length dimension for the first sub-structures in the first metal structure is the same for all the first sub-structures; and wherein the other of the width dimension or length dimension for the first sub-structures in the first metal structure is different for all the first sub-structures.

In an embodiment, an integrated circuit comprises: a semiconductor substrate; a first doped region within the semiconductor substrate; a premetallization dielectric layer over the semiconductor substrate having a top surface; a first metallization layer on the top surface of the premetallization dielectric layer; a first metal contact extending from the first metallization layer to the first doped region; wherein the premetallization dielectric layer comprises a plurality of sub-layers; wherein the first metal contact comprises a corresponding plurality of first sub-contacts, each first sub-contact formed in one of the sub-layers, each first sub-contact having a width and a length, wherein the lengths of the first sub-contacts forming the first metal contact are all different from each other.

In an embodiment, an integrated circuit comprises: a semiconductor substrate; a first doped region within the semiconductor substrate; a second doped region within the semiconductor substrate; a premetallization dielectric layer over the semiconductor substrate having a top surface; a first metallization layer on the top surface of the premetallization dielectric layer; a first metal contact extending from the first metallization layer to the first doped region; a second metal contact extending from the first metallization layer to the second doped region; wherein the premetallization dielectric layer comprises a plurality of sub-layers; wherein the first metal contact comprises a corresponding plurality of first sub-contacts, each first sub-contact formed in one of the sub-layers, each first sub-contact having a width and a length, wherein the lengths of the first sub-contacts forming the first metal contact are all different from each other and increase in length the further the first sub-contact is away from the first doped region; and wherein the second metal contact comprises a corresponding plurality of second sub-contacts, each second sub-contact formed in one of the sub-layers, each second sub-contact having a width and a length, wherein the lengths of the second sub-contacts forming the second metal contact are all different from each other and decrease in length the further the second sub-contact is away from the second doped region.

BRIEF DESCRIPTION OF THE DRAWINGS

For a better understanding of the embodiments, reference will now be made by way of example only to the accompanying figures in which.

The illustrations provided are not necessarily drawn to scale.

DETAILED DESCRIPTION OF THE DRAWINGS

Figure 2A:
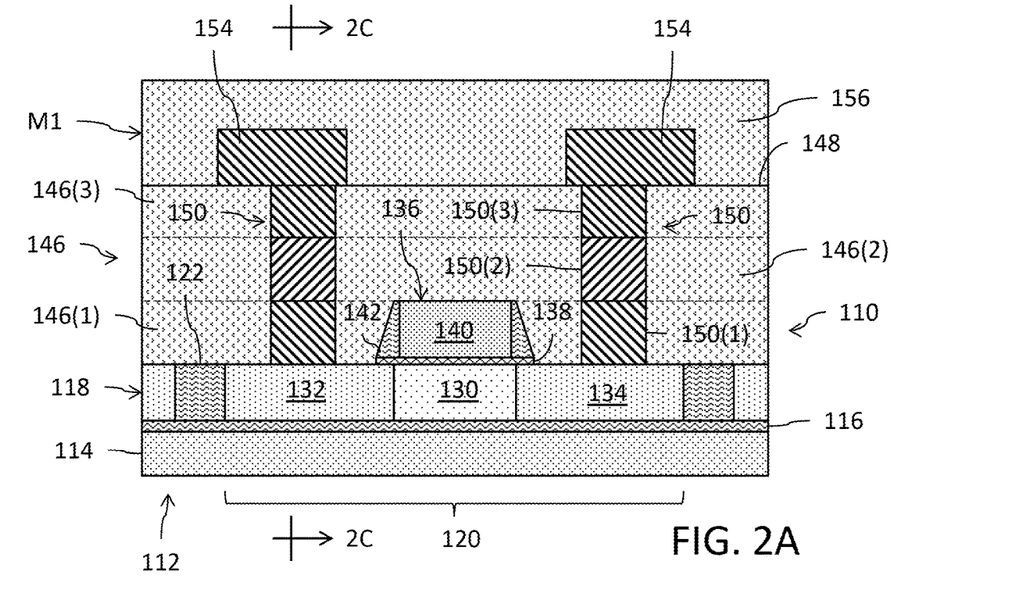
FIGS. 2A-2D illustrate the configuration of contacts in accordance with an embodiment implemented with an example of a MOSFET device.
Figure 2B:
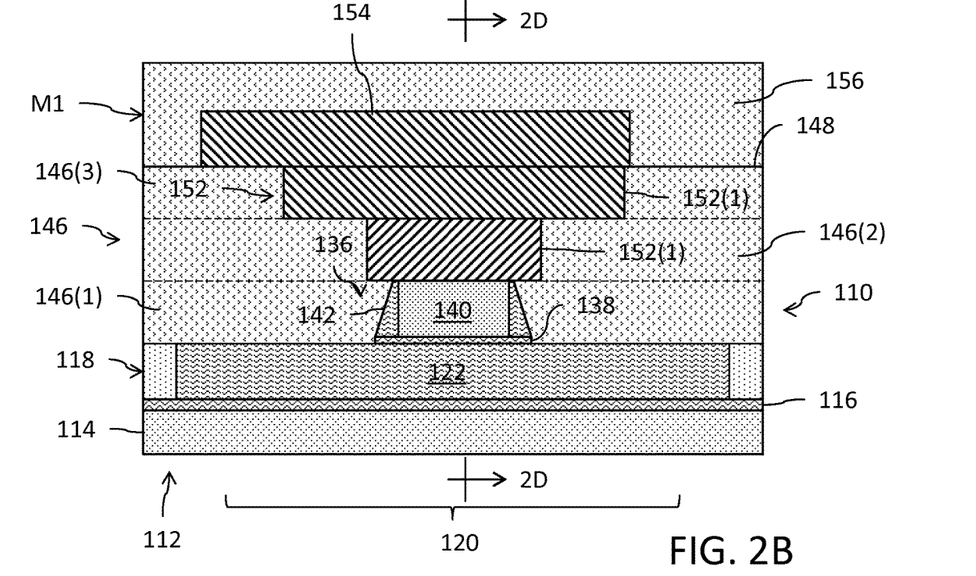
Figure 2C:
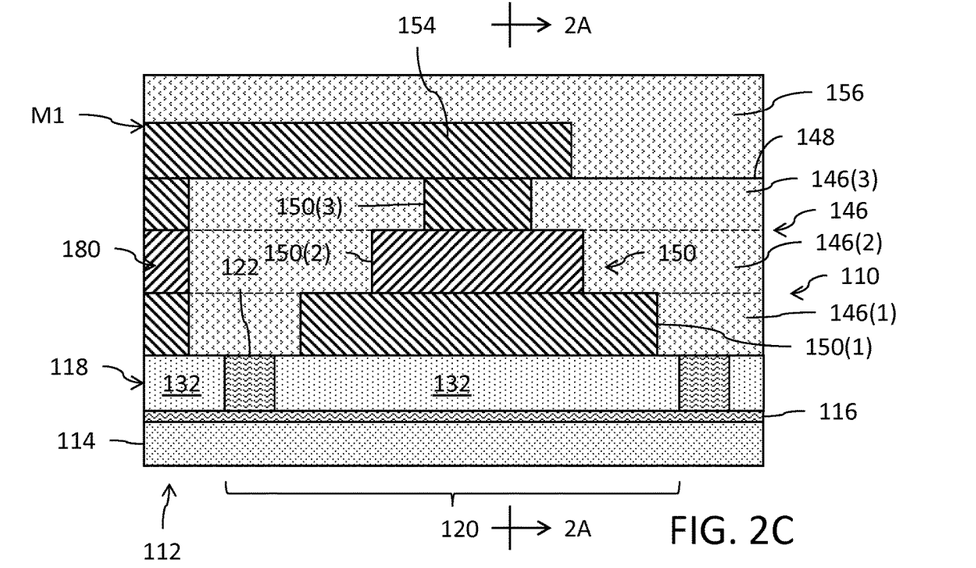
Figure 2D:
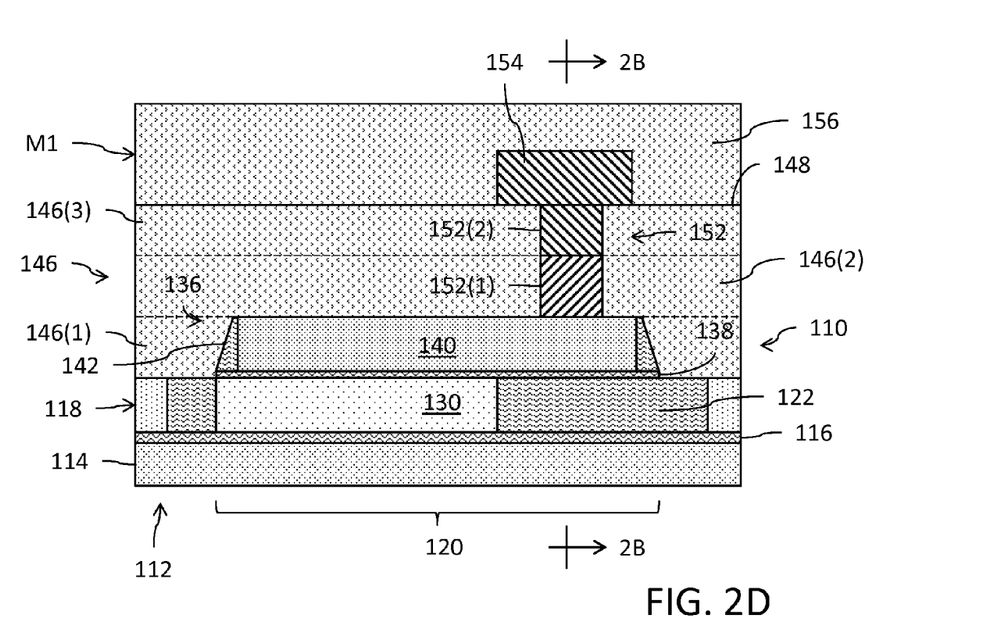

Reference is now made to FIGS. 2A-2D which illustrate the configuration of contacts in accordance with an embodiment implemented with an example of a MOSFET device 110 as an integrated circuit. FIGS. 2A-2B are parallel cross-sectional views taken offset from each other in a direction into/out of the page. FIGS. 2C-2D are parallel cross-sectional views taken offset from each other in a direction into/out of the page, with the views of FIGS. 2C-2D being orthogonal to the views of FIGS. 2A-2B.

A substrate 112 supports the MOSFET device 110. In this example, the substrate is of the silicon-on-insulator substrate 112 type which includes a substrate layer 114, a buried oxide (BOX) layer 116 and a semiconductor layer 118 (although it will be understood that the features disclosed herein are equally applicable to integrated circuits fabrication with a bulk or other semiconductor substrate as support). An active region 120 for the transistor device is delimited by a peripherally surrounding shallow trench isolation 122 that penetrates through the layer 118. Within the active region 120, the layer 118 is divided into a channel region 130 which has been doped with a first conductivity type dopant, a source region 132 (adjacent the channel region 130 on one side) which has been doped with a second conductivity type dopant, and a drain region 134 (adjacent the channel region 130 on an opposite side from the source region 132) which has also been doped with the second conductivity type dopant. Where the MOSFET 110 device is of the p-channel type, the first conductivity type dopant is p-type and the second conductivity type is n-type. Conversely, where the MOSFET device is of the n-channel type, the first conductivity type dopant is n-type and the second conductivity type is p-type. A gate stack 136 is provided above the channel region 130. This gate stack 136 typically comprises a gate dielectric 138, a polysilicon material gate electrode 140 and sidewall spacers 142 made of an insulating material such as silicon nitride (SiN) deposited on the sides of the gate dielectric 138 and polysilicon material gate electrode 140. An interlevel dielectric (ILD) or pre-metallization dielectric (PMD) layer 146 is provided above the substrate and the gate stack. A top surface 148 of the layer 146 is processed with a chemical-mechanical polishing (CMP) process to define a planar surface.

The ILD/PMD layer 146 comprises a plurality of sub-layers including: a first sub-layer 146(1), a second sub-layer 146(2) and a third sub-layer 146(3). Although three sub-layers are shown, it will be understood that layer 146 may comprise more sub-layers than three if demanded by the application and the geometry of the device. The first sub-layer 146(1) has a thickness which is generally the same as a thickness of the gate stack 136. This is not a requirement, but in many instances the sub-layer 146(1) is deposited and chemically-mechanically polished (CMP) stopping at the top of the gate stack 136. This operation may be performed in connection with implementation of replacement gate processes as known in the art. The second and third sub-layers 146(2) and 146(3) may have thicknesses as desired, which may be thicker, thinner or generally equal to the thickness of the first sub-layer 146(1). These additional sub-layers beyond sub-layer 146(1) are provided to increase the thickness of the layer 146 to a desired thickness separating the substrate from back-end-of-line (BEOL) structures such as metallization layers.

A set of metal contacts 150, typically formed of tungsten, extend from the top surface 148 through the ILD/PMD layer 146 to make electrical contact with each of the source region 132 and drain region 134. A metal contact 152, typically formed of tungsten, extends from the top surface 148 through the ILD/PMD layer 146 to make electrical contact with the gate electrode 140.

With respect to the contacts 150 for the source region 132 and drain region 134, a first sub-contact 150(1) is provided in the first sub-layer 146(1). The first sub-contact 150(1) has a thickness equal to the thickness of the first sub-layer 146(1). The first sub-contact 150(1) has a first width as shown in FIG. 2A and a first length as shown in FIG. 2C.

Additionally, a second sub-contact 150(2) is provided in the second sub-layer 146(2). The second sub-contact 150(2) has a thickness equal to the thickness of the second sub-layer 146(2). The second sub-contact 150(2) has a second width as shown in FIG. 2A and a second length as shown in FIG. 2C which is different from the first length. The second width may, for example, equal the first width and the second length may be less than the first length.

Additionally, a third sub-contact 150(3) is provided in the third sub-layer 146(3). The third sub-contact 150(3) has a thickness equal to the thickness of the third sub-layer 146(3). The third sub-contact 150(3) has a third width as shown in FIG. 2A and a third length as shown in FIG. 2C different from the first and second lengths. The third width may, for example, equal the first and second widths and the third length may be less than the second length.

The first, second and third sub-contacts 150(1)-150(3) are in series electrical connection with each other to define the contact 150 which extends from the top surface 148 through the ILD/PMD layer 146 to make physical and electrical contact with the source region 132 or drain region 134. It will be noted that the lengths of the sub-contacts 150 progressively decrease in size the further the sub-contact is from the planar surface 148.

With respect to the contact 152 for the gate electrode 140, a first sub-contact 152(1) is provided in the second sub-layer 146(2). The first sub-contact 152(1) has a thickness equal to the thickness of the second sub-layer 146(2). The first sub-contact 152(1) has a first width as shown in FIG. 2D and a first length as shown in FIG. 2B.

Additionally, a second sub-contact 152(2) is provided in the third sub-layer 146(3). The second sub-contact 152(2) has a thickness equal to the thickness of the third sub-layer 146(3). The second sub-contact 152(2) has a second width as shown in FIG. 2D and a second length as shown in FIG. 2B different from the first length. The second width may, for example, equal the first width and the second length may be greater than the first length.

The first and second sub-contacts 152(1)-152(2) are in series electrical connection with each other to define the contact 150 which extends from the top surface 148 through the ILD/PMD layer 146 to make physical and electrical contact with the gate electrode 140. It will be noted that the lengths of the sub-contacts 152 progressively increase in size the further the sub-contact is from the planar surface 148.

In an embodiment, a volume of conductive material for the contact 150 (to either the source region or drain region) is substantially equal to a volume of conductive material for the contact 152 (to the gate region). In this context, the volumes of conductive material are considered to be substantially equal if they are within 5% of each other. To accomplish this design goal, the layout designer selects the widths and lengths of the sub-contacts for each of the sub-layers.

A first metallization layer M1 is then provided at the top surface 148 of the ILD/PMD layer 146, with the first metallization layer M1 comprising metal lines 154 in contact with the contacts 150 and 152 and surrounded by a planarized dielectric material layer 156. Additional metallization layers (not shown) may be provided above the first metallization layer M1 in a manner well known in the art. The metallization layers may, for example, be formed using well known damascene processes. The metal lines 154 of the metallization layer M1 are configured to make physical and electrical contact to a plurality of contacts such as, for example, shown in FIG. 2C at reference 180 with metal line 154 making electrical connection through contacts to two different source regions 132. The illustration of source region contact is by example only as the metal lines of the metallization layer M1 may be provided to make contact to multiple drain regions, multiple gate regions or multiple combinations of source, drain and gate regions in accordance with the integrated circuit design.

Figure 3:
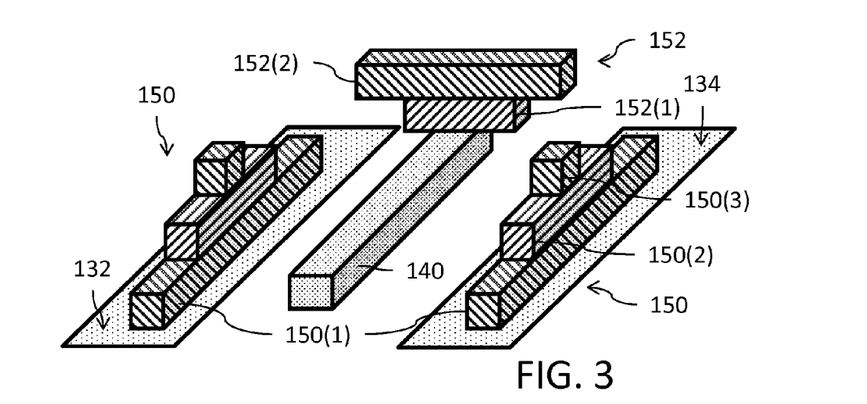
FIG. 3 illustrates a perspective view of the gate electrode and the contacts for the configuration shown in FIGS. 2A-2D.

FIG. 3 illustrates a perspective view of the gate electrode 140 and the contacts 150 and 152 for the configuration shown in FIGS. 2A-2D. The contacts 150 are shown in contact with and extending upwardly from the source region 132 and drain region 134 formed in the substrate 112 semiconductor layer 118. The contact 152 is shown in contact with and extending upwardly from the gate electrode 140 formed above the substrate 112 semiconductor layer 118.

Figure 4A:
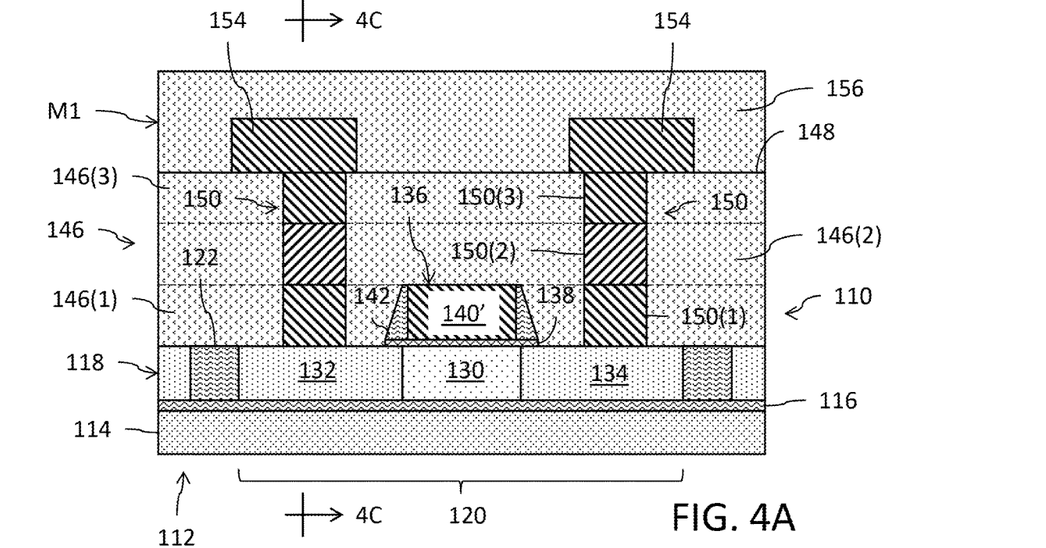
FIGS. 4A-4D illustrate the configuration of contacts in accordance with an embodiment implemented with an example of a MOSFET device.
Figure 4B:
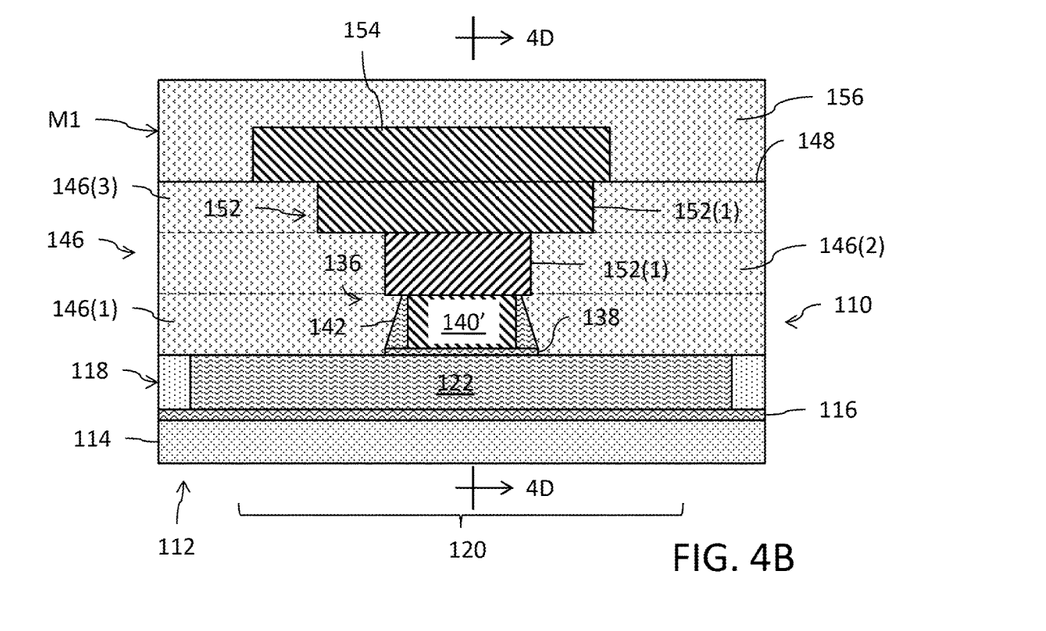
Figure 4C:
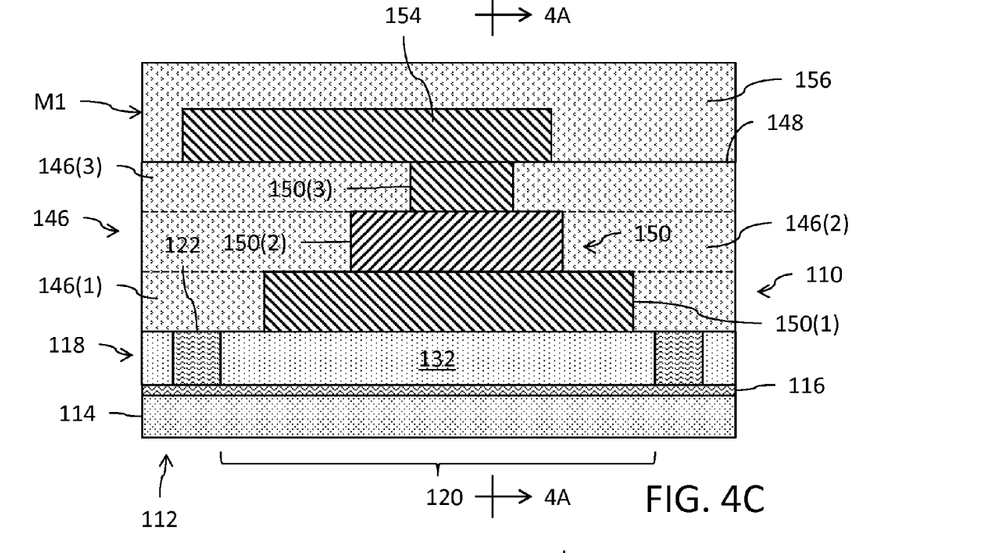
Figure 4D:
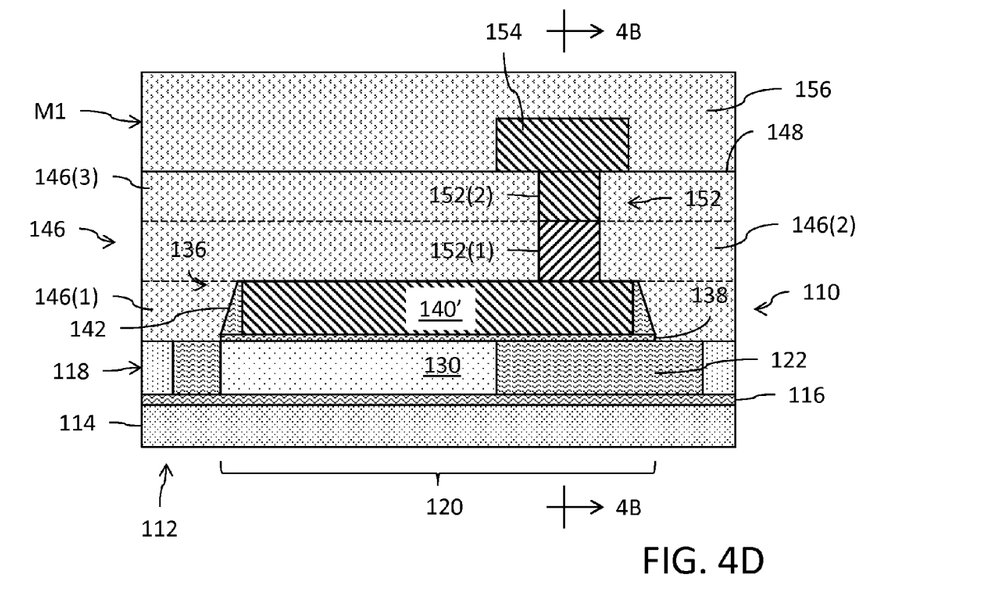
Figure 5:
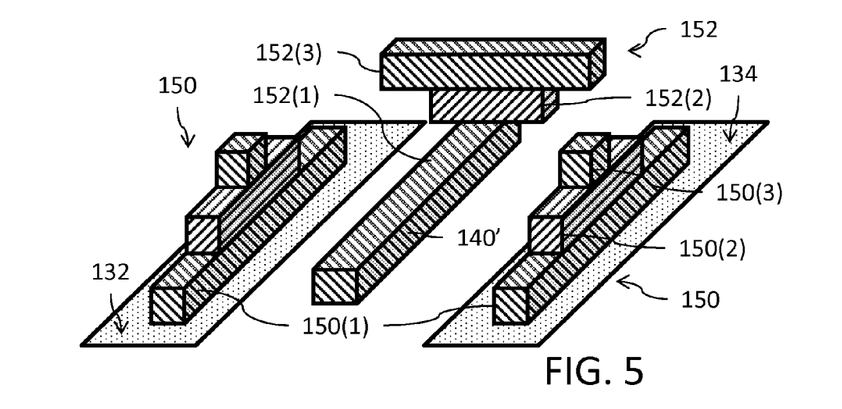
FIG. 5 illustrates a perspective view of the gate electrode and the contacts for the configuration shown in FIGS. 4A-4D.

In an embodiment utilizing a replacement metal gate technology, the gate electrode 140 may instead comprise a metal fill material 140' as shown in FIGS. 4A-4D with FIG. 5 illustrating a perspective view of the gate electrode 140' and the contacts 150 and 152. Like reference numbers refer to like or similar parts as described above.

In this configuration, with respect to the contacts 152 for the gate electrode, a first sub-contact 152(1) comprising the replacement metal gate 140' is provided in the first sub-layer 146(1). The first sub-contact 150(1) has a thickness generally equal to the thickness of the first sub-layer 146(1) (taking into account other structures of the gate stack such as the gate dielectric and work function metal, for example). The first sub-contact 150(1) has a first width as shown in FIG. 4D and a first length as shown in FIG. 4B.

Additionally, a second sub-contact 152(2) is provided in the second sub-layer 146(2). The second sub-contact 152(2) has a thickness equal to the thickness of the second sub-layer 146(2). The second sub-contact 152(2) has a second width as shown in FIG. 4D and a second length as shown in FIG. 4B. It will be note in this implementation the length of the second sub-contact 152(2) extends perpendicular to the length of the first sub-contact 152(1). The length of the second sub-contact 152(2) is likely to be different from the length of the first sub-contact 152(1). The second width may, for example, equal the first width and the second length may be greater than or less than the first length depending on application.

Additionally, a third sub-contact 152(3) is provided in the third sub-layer 146(3). The third sub-contact 152(3) has a thickness equal to the thickness of the third sub-layer 146(3). The third sub-contact 152(3) has a third width as shown in FIG. 4D and a third length as shown in FIG. 4B which is different from the second length. The third width may, for example, equal the first and second widths and the third length may be greater than the second length.

Figure 6:
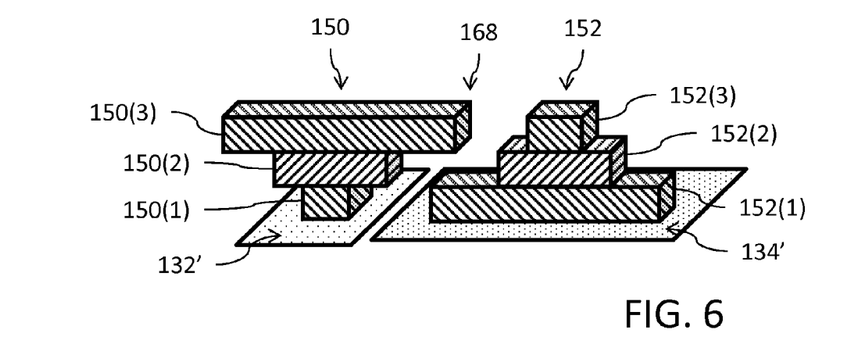
FIGS. 6-8 illustrates perspective views of alternative arrangements of the contacts.

Although the contacts 150 and 152 are shown in FIGS. 3 and 5 to extend in their lengths generally perpendicular to each other, it will be understood that this is not a requirement. FIG. 6 illustrates a perspective view of the contacts 150 and 152 in a configuration where the lengths of the contacts extend parallel to each other. FIG. 6 further shows contact 150 in contact with and extending upwardly from a first region 132' formed in the substrate 112 semiconductor layer 118, and shows contact 152 in contact with and extending upwardly from a second region 134' formed in the substrate 112 semiconductor layer 118. The regions 132' and 134' may, for example, comprise source and drain regions, respectively, of a transistor device. The regions 132' and 134' may alternatively comprise any substrate region in an integrated circuit device (for example, bipolar transmitter emitter region, bipolar transmitter base region, bipolar transmitter collector region, FinFET structure regions, or UTBB/ETSOI planar source, drain or gate regions). It will further be noted that the lengths of the sub-contacts are different with respect to each of the sub-contacts forming a contact. For one contact (for example, contact 150), the lengths increase moving away from the substrate doped region 132', and for another contact (for example, contact 152), the lengths decrease moving away from the substrate doped region 134'. In an embodiment, as shown in FIG. 6, the sub-contacts on different sub-layers may be configured to overlap each other as indicated at reference 168 in a direction perpendicular to the surface of the substrate.

Figure 7:
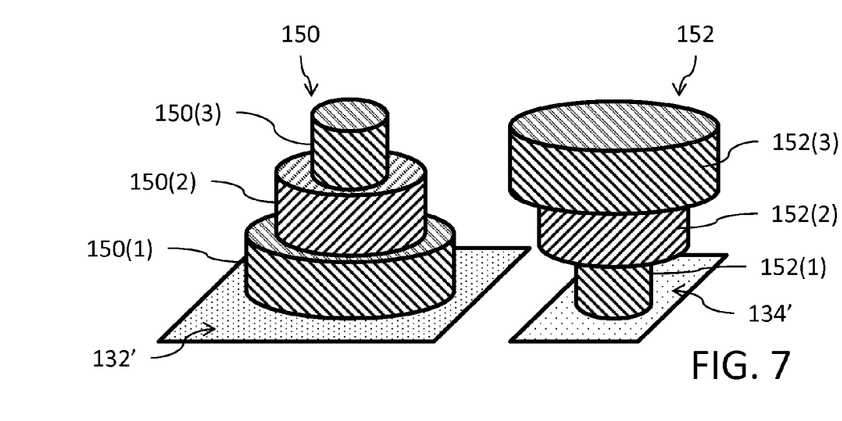

While rectangular prism structures are shown in FIGS. 3 and 5-6, it will be understood this is just an example of the shape which may be used for the contacts 150 and 152. FIG. 7 illustrates a perspective view of the contacts 150 and 152 utilizing a circular prism (cylindrical) shape. In this implementation, it will be noted that the lengths (specifically, the diameters) of the sub-contacts are different with respect to each of the sub-contacts forming a contact. For one contact (for example, contact 150), the lengths (diameters) decrease moving away from the substrate doped region 132', and for another contact (for example, contact 152), the lengths (diameters) increase moving away from the substrate doped region 134'.

Figure 8:
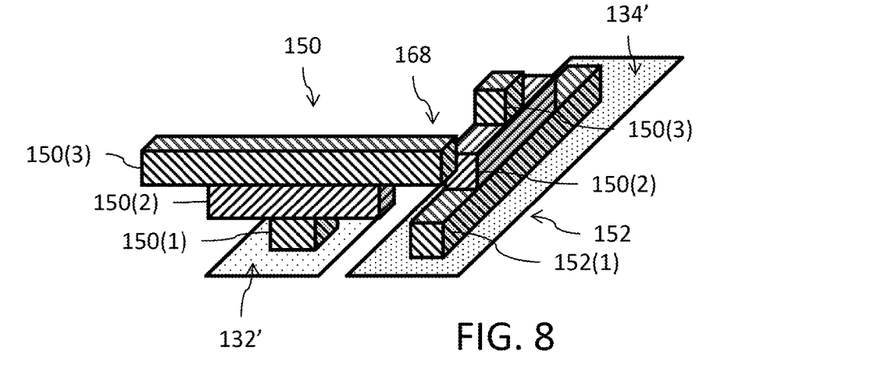

FIG. 8 shows contacts 150 and 152 in a perpendicular orientation like that shown in FIGS. 3 and 5. It will further be noted that the lengths of the sub-contacts are different with respect to each of the sub-contacts forming a contact. For one contact (for example, contact 150), the lengths increase moving away from the substrate doped region 132', and for another contact (for example, contact 152), the lengths decrease moving away from the substrate doped region 134'. FIG. 8 further shows, at reference 168, a perpendicular overlap with respect to sub-contacts in different sub-layers.

It will be noted that a volume of conductive material in the first and second contacts of the implementations shown in FIGS. 6-8 is preferably substantially equal. In this context, the volumes of conductive material are considered to be substantially equal if they are within 5% of each other.

In an embodiment, the first sub-contact 150(1) and the first sub-contact 152(1) in any of the disclosed implementations may be made of a first metal material such as, for example, tungsten. The remaining sub-contacts, such as the second and third sub-contacts 150(2)-150(3) and second and third sub-contacts 152(2) and 152(3) may be made of the same first material or, in an alternative implementation, made of a second metal material such as, for example, copper. In this regard, the metal material used for the metal lines 154 of the metallization layer M1 may also comprise, for example, copper. This use of the first metal material (tungsten) is consistent with the use of tungsten material for contacts and replacement metal gate structures at the first sub-layer, while the use of the second material (copper) for the sub-contacts in the remaining sub-layers supports the known advantages of copper use for wiring lines in integrated circuit devices. Aluminum presents an alternative second material choice. Each of the sub-contacts may further include a barrier liner (for example, made of titanium nitride (TiN)) to protect against diffusion of the metal species used for the sub-contact into the sub-layers of the ILD/PMD layer 146.

Conventional deposit, pattern and fill process steps may be used to produce the sub-layers and sub-contacts. For example, a mask defining the location of openings for the sub-contacts may be produced on top of a given sub-layer of the ILD/PMD layer 146. An opening is then formed in that given sub-layer using the mask and a reactive ion etch (RIE) is performed through the mask. The etch should extend completely through the given sub-layer to form the opening. An atomic layer deposition (ALD) technique is then used to deposit the metal barrier liner (such as TiN) on the walls of the opening, and a metal filling process (such as thermal chemical vapor deposition (CVD)) is then used to fill the opening with the metal material of the sub-contact (such as tungsten or copper). A chemical-mechanical polishing (CMP) process is then performed to remove excess metal barrier and fill material, with the CMP stopping at the top of the given sub-layer of the ILD/PMD layer 146. A chemical vapor deposition (CVD) process is then performed to deposit the next sub-layer of the ILD/PMD layer 146. The previous steps are then repeated to form the sub-contact in that next sub-layer. The process may be repeated as many times as are necessary to define the thickness of the ILD/PMD layer 146 from multiple deposited, patterned and filled sub-layers with sub-contacts. For example, the ILD/PMD layer 146 may have a thickness of 120-140 nm, with each sub-layer having a thickness of between 30-100 nm. The minimum width of the sub-contacts is set by the minimum dimension of the lithographic process used for fabrication. Conventional back-end-of-line (BEOL) processes are then performed to provide the necessary metallization levels.

Although specific reference is made herein to a planar MOSFET device and the formation of contacts for source, drain and gate, it will be understood that the techniques and structures for contacts described herein are applicable to an integrated circuit device including, without limitation, bipolar transistor devices, FinFET devices, diode devices, planar transistor devices with source and drain regions formed from UTBB or ETSOI substrates, and the like.

Figure 9:
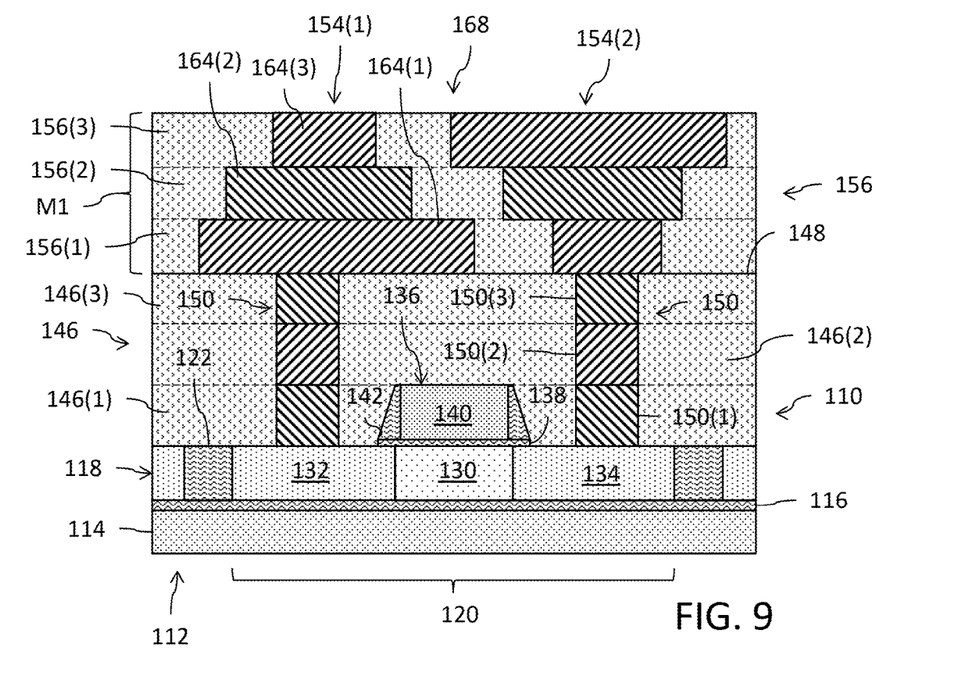
FIG. 9 illustrates the configuration of metal-filled vias and trenches for a metallization layer of an integrated circuit.

The structures described above for use as contacts in the ILD/PMD layer 146 may be advantageously extended for use in metallization layers. Reference is accordingly made to FIG. 9 which illustrates the configuration of metal-filled vias and trenches for a metallization layer M1 of an integrated circuit. The metallization layer M1 includes a dielectric material layer 156 having a planar top surface 158 that is formed on the top surface 148 of the ILD/PMD layer 146. Metal lines 154(1) and 154(2), typically formed of copper or aluminum, are formed in the dielectric material layer 156 to extend from the top surface 158 to the top surface 148 in order to make physical and electrical connection to contacts 150 and/or 152.

FIG. 9 shows the structures in the substrate and the ILD/PMD layer 146 as presented in FIGS. 2A-2D, but it will be understood that the structures as shown in FIGS. 4A-4D are equally applicable.

The dielectric material layer 156 comprises a plurality of sub-layers including: a first sub-layer 156(1), a second sub-layer 156(2) and a third sub-layer 156(3). Although three sub-layers are shown, it will be understood that layer 156 may comprise more sub-layers than three if demanded by the application and the geometry of the device. The first, second and third sub-layers 156(1), 156(2) and 156(3) may have different or substantially same thicknesses as desired by the application and routing of wiring.

Although disclosed in the context of the M1 metallization layer, it will be understood that the sub-layers are equally applicable to any of the included further metallization layers (M2-Mn) required by the integrated circuit.

With respect to the metal line 154(1), a first sub-line 164(1) is provided in the first sub-layer 156(1). The first sub-line 164(1) has a thickness equal to the thickness of the first sub-layer 156(1). The first sub-line 164(1) has a first width and a first length.

Additionally, a second sub-line 164(2) is provided in the second sub-layer 156(2). The second sub-line 164(2) has a thickness equal to the thickness of the second sub-layer 156(2). The second sub-line 164(2) has a second width which is different from the first width and a second length. The second width may, for example, be less than the first width and the second length may be equal to the first length.

Additionally, a third sub-line 164(3) is provided in the third sub-layer 156(3). The third sub-line 164(3) has a thickness equal to the thickness of the third sub-layer 156(3). The third sub-line 164(3) has a third width different from the first and second widths and a third length. The third width may, for example, be less than the first and second widths and the third length may be equal to the second length.

The first, second and third sub-lines 164(1)-164(3) are in series electrical connection with each other to define the first line 154(1) which extends from the top surface 158 through the dielectric layer 156 to make physical and electrical contact with the contact 150 for the source region 132. It will be noted that the widths of the sub-lines 164 progressively decrease in size the further the sub-line is from the planar surface 148.

With respect to the metal line 154(2), a first sub-line 164(1) is provided in the first sub-layer 156(1). The first sub-line 164(1) has a thickness equal to the thickness of the first sub-layer 156(1). The first sub-line 164(1) has a first width and a first length.

Additionally, a second sub-line 164(2) is provided in the second sub-layer 156(2). The second sub-line 164(2) has a thickness equal to the thickness of the second sub-layer 156(2). The second sub-line 164(2) has a second width which is different from the first width and a second length. The second width may, for example, greater than the first width and the second length may be equal to the first length.

Additionally, a third sub-line 164(3) is provided in the third sub-layer 156(3). The third sub-line 164(3) has a thickness equal to the thickness of the third sub-layer 156(3). The third sub-line 164(3) has a third width different from the first and second widths and a third length. The third width may, for example, be greater than the first and second widths and the third length may be equal to the second length.

The first, second and third sub-lines 164(1)-164(3) are in series electrical connection with each other to define the second line 154(2) which extends from the top surface 158 through the dielectric layer 156 to make physical and electrical contact with the contact 150 for the drain region 134. It will be noted that the widths of the sub-lines 164 progressively increase in size the further the sub-contact is from the planar surface 148.

In an embodiment, a volume of conductive material for the first line 154(1) is substantially equal to a volume of conductive material for the second line 154(2). In this context, the volumes of conductive material are considered to be substantially equal if they are within 5% of each other. To accomplish this design goal, the layout designer selects the widths and lengths of the sub-lines for each of the sub-layers.

Additionally, the first and second sub-lines are positioned immediately adjacent each other without any intervening metal structure within said same dielectric layer 156. In this configuration, a first spacing distance in a direction parallel to the planar surfaces between first and second sub-lines on different sub-layers is less than a second spacing distance the direction parallel to the planar surfaces between first and second sub-lines located on different sub-layers. Indeed, this first spacing distance may be negative in that some overlap between sub-lines on different sub-layers in the vertical direction perpendicular to the planar surfaces is provided. This overlap is generally indicated at reference 168.

Figure 10:
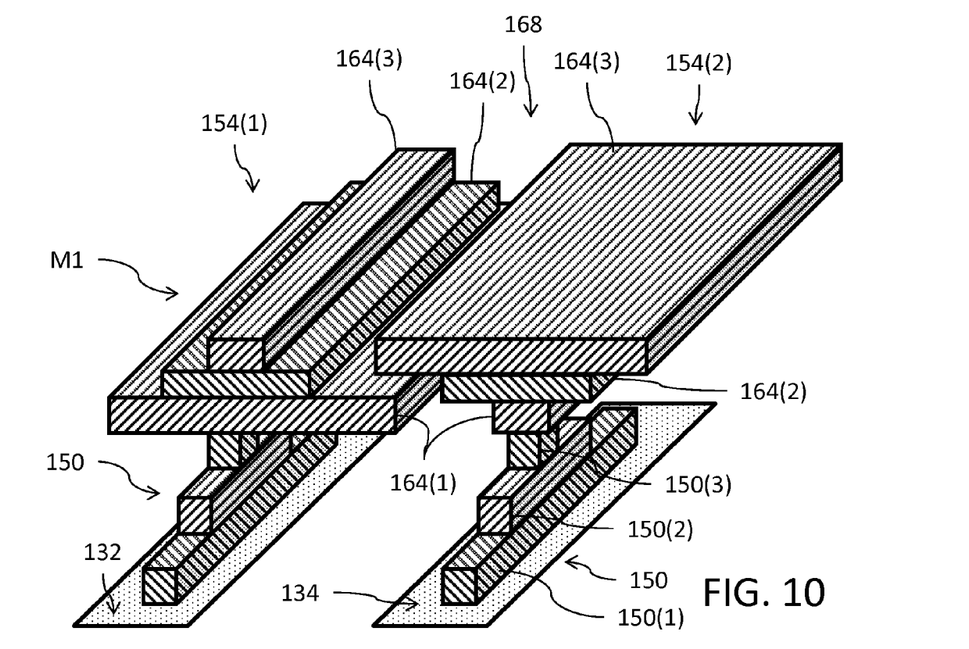
FIG. 10 illustrates a perspective view of certain structures shown in FIG. 9.

FIG. 10 illustrates a perspective view of the contacts 150 and the lines 154(1) and 154(2) for the configuration shown in FIG. 9 (wherein the structures relating to the gate electrode and contact 152 are omitted to simplify the illustration and ensure visibility of the structures for the contacts 150 and the lines 154(1) and 154(2)).

Figure 11:
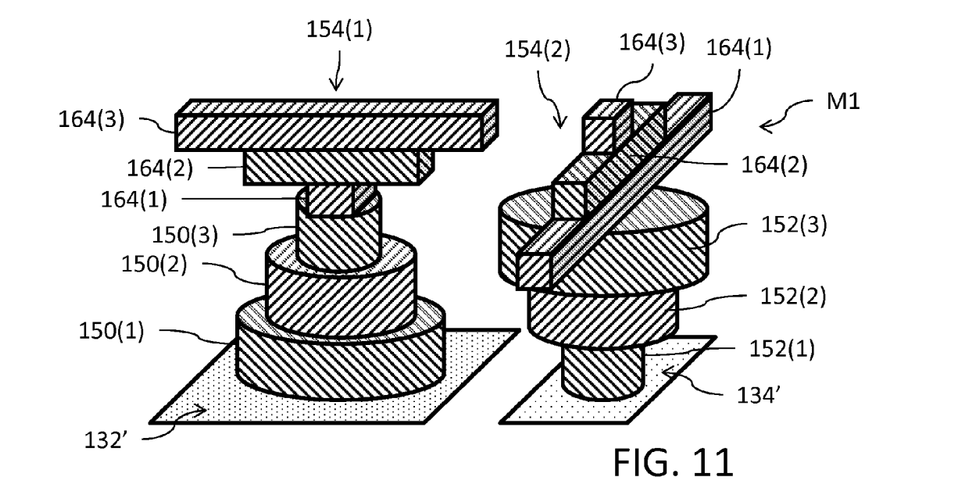
FIG. 11 illustrates a perspective view of an alternate structure.

Although the lines 154(1) and 154(2) are shown in FIG. 10 to extend in their lengths generally parallel to each other, it will be understood that this is not a requirement. Instead, the lines 154(1) and 154(2) could extend in their lengths perpendicular to each other as shown in FIG. 11.

Each of the sub-lines may further include a barrier liner (for example, made of titanium nitride (TiN)) to protect against diffusion of the metal species used for the sub-line into the sub-layers of the dielectric material layer 156.

Conventional deposit, pattern and fill process steps may be used to produce the sub-layers and sub-lines. For example, a mask defining the location of openings for the sub-lines may be produced on top of a given sub-layer of the dielectric material layer 156. An opening is then formed in that given sub-layer using the mask and a reactive ion etch (RIE) is performed through the mask. The etch should extend completely through the given sub-layer to form the opening. An atomic layer deposition (ALD) technique is then used to deposit the metal barrier liner (such as TiN) on the walls of the opening, and a metal filling process (such as thermal chemical vapor deposition (CVD)) is then used to fill the opening with the metal material of the sub-line (such as copper or aluminum). A chemical-mechanical polishing (CMP) process is then performed to remove excess metal barrier and fill material, with the CMP stopping at the top of the given sub-layer of the dielectric material layer 156. A chemical vapor deposition (CVD) process is then performed to deposit the next sub-layer of the dielectric material layer 156. The previous steps are then repeated to form the sub-line in that next sub-layer. The process may be repeated as many times as are necessary to define the thickness of the metallization layer from multiple deposited, patterned and filled sub-layers with sub-lines. For example, the metallization layer may have a thickness of 48 to 120 nm, with each sub-layer having a thickness of between 16 and 40 nm. The minimum dimension of the sub-lines is set by the minimum dimension of the lithographic process used for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An integrated circuit, comprising:
   an insulating layer having a planar top surface;
   a first metal structure within the insulating layer;
   wherein the insulating layer comprises a plurality of sub-layers;
   wherein the first metal structure comprises a corresponding plurality of first sub-structures, each first sub-structure formed in one of the sub-layers and having a thickness equal to a thickness of the sub-layer within which it is formed, each first sub-structure having a width dimension and a length dimension;
   wherein one of the width dimension or length dimension for the first sub-structures in the first metal structure is the same for all the first sub-structures; and
   wherein the other of the width dimension or length dimension for the first sub-structures in the first metal structure is different for all the first sub-structures.

2. The integrated circuit of claim 1, wherein the insulating layer is a premetallization dielectric layer and the first metal structure is a metal contact made to a doped semiconductor substrate region.

3. The integrated circuit of claim 1, wherein the insulating layer is a dielectric layer for a single metallization layer and the first metal structure is a metal interconnect line.

4. The integrated circuit of claim 1, wherein the other of the width dimension or length dimension for the first sub-structures in the first metal structure that is different progressively increases in size the further the first sub-structure is located from the planar top surface.

5. The integrated circuit of claim 1, wherein the other of the width dimension or length dimension for the first sub-structures in the first metal structure that is different progressively decreases in size the further the first sub-structure is located from the planar top surface.

6. The integrated circuit of claim 1, further comprising:
a second metal structure within the same insulating layer;
wherein the second metal structure comprises a corresponding plurality of second sub-structures in direct contact with each other, each second sub-structure formed in one of the sub-layers and having a thickness equal to a thickness of the sub-layer within which it is formed, each second sub-structure having a width dimension and a length dimension;
wherein one of the width dimension or length dimension for the second sub-structures in the second metal structure is the same for all the second sub-structures; and
wherein the other of the width dimension or length dimension for the second sub-structures in the second metal structure is different for all the sub-structures.

7. The integrated circuit of claim 6, wherein the first and second metal structures are immediately adjacent each other without any intervening metal structure within said same insulating layer.

8. The integrated circuit of claim 7,
wherein the other of the width dimension or length dimension for the first sub-structures in the first metal structure that is different progressively increases in size the further the first substructure is located from the planar top surface; and
wherein the other of the width dimension or length dimension for the second substructures in the second metal structure that is different progressively decreases in size the further the second sub-structure is located from the planar top surface.

9. The integrated circuit of claim 7, wherein a first spacing distance in a direction parallel to the planar top surface between first and second sub-structures on different sub-layers is less than a second spacing distance the direction parallel to the planar top surface between first and second sub-structures located on different sub-layers.

10. The integrated circuit of claim 6, wherein one of the first sub-structures at least partially overlaps one of the second sub-structures in a direction perpendicular to the planar top surface.

11. The integrated circuit of claim 1, wherein the plurality of first sub-structures forming the first metal structure are all made of a same metal material.

12. The integrated circuit of claim 1, wherein a first one of the first sub-structures is made of a first metal material and all other ones of the first sub-structures are made of a second metal material different from the first metal material.

13. The integrated circuit of claim 12, wherein the first metal material is tungsten and the second metal material is copper.

14. An integrated circuit, comprising:
a semiconductor substrate;
a first doped region within the semiconductor substrate;
a premetallization dielectric layer over the semiconductor substrate having a top surface;
a first metallization layer on the top surface of the premetallization dielectric layer;
a first metal contact extending from the first metallization layer to the first doped region;
wherein the premetallization dielectric layer comprises a plurality of sub-layers;
wherein the first metal contact comprises a corresponding plurality of first sub-contacts, each first sub-contact formed in one of the sub-layers, each first sub-contact having a width and a length, wherein widths of the first sub-contacts forming the first metal contact are all the same and wherein the lengths of the first sub-contacts forming the first metal contact are all different from each other.

15. The integrated circuit of claim 14, wherein the lengths of the first sub-contacts in forming the first metal contact increase in size the further the first sub-contact is away from the first doped region.

16. The integrated circuit of claim 14, wherein the lengths of the first sub-contacts in forming the first metal contact decrease in size the further the first sub-contact is away from the first doped region.

17. The integrated circuit of claim 14, wherein the plurality of first sub-contacts forming the contact are all made of a same metal material.

18. The integrated circuit of claim 14, wherein a first one of the first sub-contacts adjacent the first doped region is made of a first metal material and all other ones of the first sub-contacts are made of a second metal material different from the first metal material.

19. The integrated circuit of claim 18, wherein the first metal material is tungsten and the second metal material is copper.

20. The integrated circuit of claim 14, wherein the first doped region is a transistor conductive terminal.

21. The integrated circuit of claim 14, wherein the transistor conductive terminal is selected from the group consisting of: source, drain, emitter and collector.

22. The integrated circuit of claim 14, further comprising:
a second doped region within the semiconductor substrate;
a second metal contact extending from the first metallization layer to the second doped region;
wherein the second metal contact comprises a corresponding plurality of second sub-contacts, each second sub-contact formed in one of the sub-layers, each second sub-contact having a width and a length, wherein the lengths of the second sub-contacts forming the second metal contact are all different from each other.

23. The integrated circuit of claim 22, wherein the lengths of the first sub-contacts in forming the first metal contact increase in size the further the first sub-contact is away from the first doped region, and wherein the lengths of the second sub-contacts in forming the second metal contact decrease in size the further the second sub-contact is away from the second doped region.

24. The integrated circuit of claim 14, further comprising:
a second doped region within the semiconductor substrate adjacent the first doped region;
an electrode formed above the second doped region;
a second metal contact extending from the first metallization layer to the electrode;
wherein the second metal contact comprises a corresponding plurality of second sub-contacts, each second sub-contact formed in one of the sub-layers, each second sub-contact having a width and a length, wherein the lengths of the second sub-contacts forming the second metal contact are all different from each other.

25. The integrated circuit of claim 24, wherein the lengths of the first sub-contacts in forming the first metal contact increase in size the further the first sub-contact is away from the first doped region, and wherein the lengths of the second sub-contacts in forming the second metal contact decrease in size the further the second sub-contact is away from the second doped region.

26. The integrated circuit of claim 24, wherein the lengths of the first sub-contacts in forming the first metal contact decrease in size the further the first sub-contact is away from the first doped region, and wherein the lengths of the second sub-contacts in forming the second metal contact increase in size the further the second sub-contact is away from the second doped region.

27. The integrated circuit of claim 24, wherein the electrode is a control electrode for a transistor device and the first doped region is a conduction electrode for said transistor device.

28. The integrated circuit of claim 27, wherein the electrode is formed of a polysilicon material.

29. The integrated circuit of claim 27, wherein the electrode is formed of a first metal material, and wherein a first one of the first sub-contacts adjacent the first doped region is made of the first metal material.

30. The integrated circuit of claim 29, wherein all other ones of the first and second sub-contacts are made of a second metal material different from the first metal material.

31. The integrated circuit of claim 27, wherein the electrode and each of the first and second sub-contacts are formed of a same metal material.

32. The integrated circuit of claim 27, wherein the transistor device is a MOSFET device.

33. The integrated circuit of claim 14, wherein a metal line of the metallization later is electrically connected to a plurality of contacts, said first metal contact comprising one of said plurality of contacts.

34. An integrated circuit, comprising:
a semiconductor substrate;
a first doped region within the semiconductor substrate;
a second doped region within the semiconductor substrate;
a premetallization dielectric layer over the semiconductor substrate having a top surface;
a first metallization layer on the top surface of the premetallization dielectric layer;
a first metal contact extending from the first metallization layer to the first doped region;
a second metal contact extending from the first metallization layer to the second doped region;
wherein the premetallization dielectric layer comprises a plurality of sub-layers;
wherein the first metal contact comprises a corresponding plurality of first sub-contacts, each first sub-contact formed in one of the sub-layers, each first sub-contact having a width and a length, wherein widths of the first sub-contacts forming the first metal contact are all the same and wherein the lengths of the first sub-contacts forming the first metal contact are all different from each other and increase in length the further the first sub-contact is away from the first doped region; and
wherein the second metal contact comprises a corresponding plurality of second sub-contacts, each second sub-contact formed in one of the sub-layers, each second sub-contact having a width and a length, wherein widths of the second sub-contacts forming the first metal contact are all the same and wherein the lengths of the second sub-contacts forming the second metal contact are all different from each other and decrease in length the further the second sub-contact is away from the second doped region.

35. The integrated circuit of claim 34, wherein a volume of conductive material in the first contact is substantially equal to a volume of conductive material in the second contact.

36. The integrated circuit of claim 34, wherein the lengths of the first sub-contacts extend in a direction perpendicular to a direction in which the lengths of the second sub-contacts extend.

37. The integrated circuit of claim 34, wherein the lengths of the first sub-contacts extend in a direction parallel to a direction in which the lengths of the second sub-contacts extend.

* * * * *